(12) United States Patent
Hirashiki et al.

(10) Patent No.: US 8,134,421 B2
(45) Date of Patent: Mar. 13, 2012

(54) VOLTAGE CONTROL OSCILLATOR AND QUADRATURE MODULATOR

(75) Inventors: Kenichi Hirashiki, Yokohama (JP); Shinichiro Ishizuka, Yokohama (JP); Nobuyuki Itoh, Bunkyo-ku (JP)

(73) Assignee: Kabushiki Kaisha Toshiba (JP)

( * ) Notice: Subject to any disclaimer, the term of this patent is extended or adjusted under 35 U.S.C. 154(b) by 112 days.

(21) Appl. No.: 12/783,345

(22) Filed: May 19, 2010

(65) Prior Publication Data

US 2011/0050354 A1 Mar. 3, 2011

(30) Foreign Application Priority Data

Aug. 28, 2009 (JP) .................................. 2009-198368

(51) Int. Cl.
*H03B 5/12* (2006.01)
*H03B 5/18* (2006.01)
*H03B 27/00* (2006.01)
*H03C 3/00* (2006.01)
*H03C 3/22* (2006.01)
*H04B 1/26* (2006.01)

(52) U.S. Cl. ............ 332/146; 332/144; 331/45; 331/48; 331/55; 331/99; 331/108 D; 331/117 FE; 331/117 D; 331/177 V; 455/318; 455/319; 455/323; 455/325

(58) Field of Classification Search .................. 332/103, 332/105, 144, 146; 331/45, 46, 48, 55, 96, 331/99, 108 D, 117 R, 117 FE, 117 D, 167, 331/177 R, 177 V; 327/231, 237, 238, 254, 327/255

See application file for complete search history.

(56) References Cited

U.S. PATENT DOCUMENTS 6,906,596 B2    6/2005  Kitamura et al.
6,911,870 B2 *  6/2005  Gierkink et al. ................ 331/46

FOREIGN PATENT DOCUMENTS

JP    2004-120728    4/2004
(Continued)

OTHER PUBLICATIONS

Alan W.L. Ng, et al., "A 1V 17GHz 5mW Quadrature CMOS VCO bases on Transformer Coupling," IEEE International solid-state circuits conference, vol. 42, No. 9, pp. 1933-1941, Sep. 2007.

(Continued)

*Primary Examiner* — David Mis
(74) *Attorney, Agent, or Firm* — Knobbe, Martens, Olson & Bear LLP (57) ABSTRACT

A voltage control oscillator includes: first and second field effect transistors, a drain of one of which is connected to a gate of the other and a drain of the other of which is connected to a gate of the one; third and fourth field effect transistors, a drain of one of which is connected to a gate of the other and a drain of the other of which is connected to a gate of the one; a first inductor connected between the drain of the first field effect transistor and the drain of the second field effect transistor; a second inductor connected between the drain of the third field effect transistor and the drain of the fourth field effect transistor; a third inductor magnetically coupled to the first inductor; a fourth inductor magnetically coupled to the second inductor; a first capacitor that capacitively couples one end of the third inductor and one end of the fourth inductor; and a second capacitor that capacitively couples the other end of the third inductor and the other end of the fourth inductor.

20 Claims, 5 Drawing Sheets

FOREIGN PATENT DOCUMENTS

| | | |
|---|---|---|
| JP | 2005-039596 | 2/2005 |
| JP | 2007-336254 | 12/2007 |

OTHER PUBLICATIONS

Sheng-Lyang Jang, et al., "CMOS Colpitts Quadrature VCO Using the Body Injection-Locked Coupling Technique," IEEE Microwave and wireless components letters, vol. 19, No. 4, pp. 230-232, Apr. 2009.

Sander L. J. Gierkink, et al., "A Low-Phase-Noise 5-GHz CMOS Quadrature VCO Using Superharmonic Coupling," IEEE journal of solid-state circuits, vol. 38, No. 7, pp. 1148-1154, Jul. 2003.

Prior Art Information List.

Background Art Information.

* cited by examiner

VOLTAGE CONTROL OSCILLATOR AND QUADRATURE MODULATOR

CROSS-REFERENCE TO RELATED APPLICATIONS

This application is based upon and claims the benefit of priority from the prior Japanese Patent Application No. 2009-198368, filed on Aug. 28, 2009; the entire contents of which are incorporated herein by reference.

BACKGROUND OF THE INVENTION

1. Field of the Invention

The present invention relates to a voltage control oscillator and a quadrature modulator, and, more particularly is suitably applied to a voltage control oscillator and a quadrature modulator that can obtain oscillation outputs for four phases different from one another by 90°.

2. Description of the Related Art

In a communication system employing quadrature modulation, local oscillation signals having phases different from one another by 90° are used in both a modulating circuit in a transmitting unit and a demodulating circuit in a receiving unit. To generate such local oscillation signals, in some case, a quadrature voltage-controlled oscillator (QVCO) is used.

For example, Japanese Patent Application Laid-Open No. 2004-120728 discloses, in an LC resonant oscillator in which a plurality of capacitive elements are connected to output nodes, voltage for selecting an oscillation frequency band is applied to terminals on the opposite side of the capacitive elements, and the oscillation frequency band can be changed stepwise according to the selection voltage, a method of configuring the capacitive elements with variable capacitive elements.

However, in the QVCO in the past, the phases of the local oscillation signal are shifted from one another by 90° according to mutual inductance of an inductor connected to a source side of a certain field effect transistor and an inductor connected to a drain side of another field effect transistor. Therefore, in the QVCO in the past, when drain-to-source capacitance of the field effect transistors fluctuates, a phase error increases.

BRIEF SUMMARY OF THE INVENTION

A voltage control oscillator according to an embodiment of the present invention comprises: first and second field effect transistors, a drain of one of which is connected to a gate of the other and a drain of the other of which is connected to a gate of the one; third and fourth field effect transistors, a drain of one of which is connected to a gate of the other and a drain of the other of which is connected to a gate of the one; a first inductor connected between the drain of the first field effect transistor and the drain of the second field effect transistor; a second inductor connected between the drain of the third field effect transistor and the drain of the fourth field effect transistor; a third inductor magnetically coupled to the first inductor; a fourth inductor magnetically coupled to the second inductor; a first capacitor that capacitively couples one end of the third inductor and one end of the fourth inductor; and a second capacitor that capacitively couples the other end of the third inductor and the other end of the fourth inductor.

A quadrature modulator according to an embodiment of the present invention comprises: first and second field effect transistors, a drain of one of which is connected to a gate of the other and a drain of the other of which is connected to a gate of the one; third and fourth field effect transistors, a drain of one of which is connected to a gate of the other and a drain of the other of which is connected to a gate of the one; a first inductor connected between the drain of the first field effect transistor and the drain of the second field effect transistor; a second inductor connected between the drain of the third field effect transistor and the drain of the fourth field effect transistor; a third inductor magnetically coupled to the first inductor; a fourth inductor magnetically coupled to the second inductor; a first capacitor that capacitively couples one end of the third inductor and one end of the fourth inductor; a second capacitor that capacitively couples the other end of the third inductor and the other end of the fourth inductor; a first variable capacitance element connected to the one end of the third inductor; a second variable capacitance element connected to the one end of the fourth inductor; a third variable capacitance element connected to the other end of the third inductor; and a fourth variable capacitance element connected to the other end of the fourth inductor.

DETAILED DESCRIPTION OF THE INVENTION

Exemplary embodiments of the present invention are explained in detail below with reference to the accompanying drawings. The present invention is not limited by the embodiments.

Figure 1:
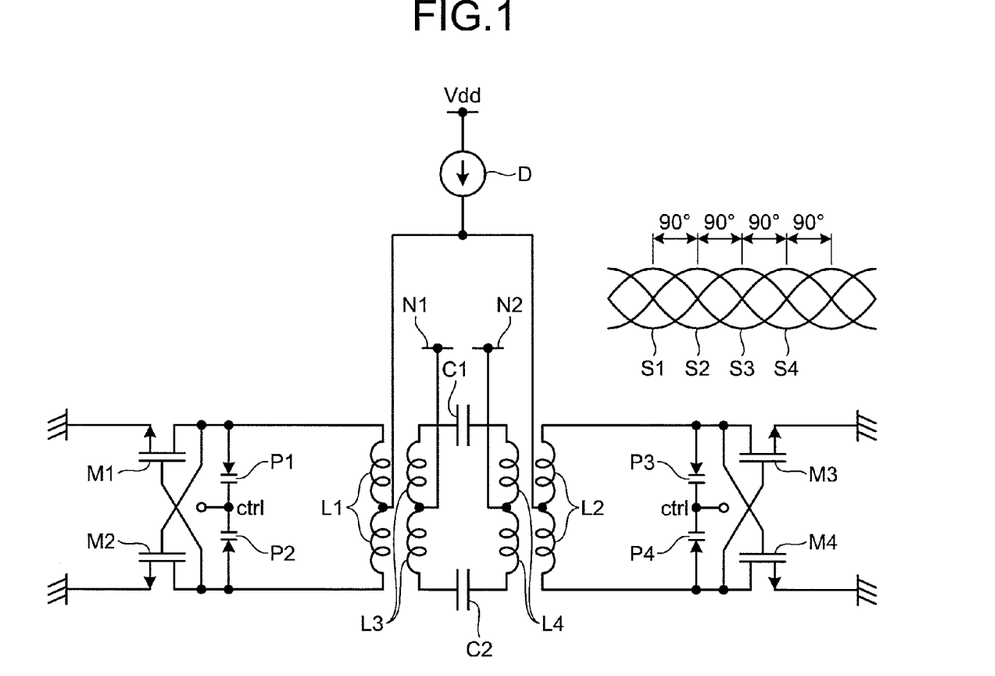
FIG. 1 is a circuit diagram of the schematic configuration of a voltage control oscillator according to a first embodiment of the present invention.

FIG. 1 is a circuit diagram of the schematic configuration of a voltage control oscillator according to a first embodiment of the present invention.

In FIG. 1, a drain of a field effect transistor M1 is connected to a gate of a field effect transistor M2. A drain of the field effect transistor M2 is connected to a gate of the field effect transistor M1. A drain of the field effect transistor M3 is connected to a gate of the field effect transistor M4. A drain of the field effect transistor M4 is connected to a gate of the field effect transistor M3.

An inductor L1 is connected between the drain of the field effect transistor M1 and the drain of the field effect transistor M2. An inductor L2 is connected between the drain of the field effect transistor M3 and the drain of the field effect transistor M4. An inductor L3 is magnetically coupled to the inductor L1. An inductor L4 is magnetically coupled to the inductor L2.

One end of the inductor L3 and one end of the inductor L4 are capacitively coupled via a capacitor C1. The other end of the inductor L3 and the other end of the inductor L4 are capacitively coupled via a capacitor C2.

Variable capacitance elements P1 and P2 are connected to each other in series. A series circuit of the variable capacitance elements P1 and P2 is connected between the drain of the field effect transistor M1 and the drain of the field effect transistor M2. Variable capacitance elements P3 and P4 are connected to each other in series. A series circuit of the variable capacitance elements P3 and P4 is connected between the drain of the field effect transistor M3 and the drain of the field effect transistor M4. A control signal ctrl for controlling the capacitances of the variable capacitance elements P1 to P4 can be input to a connection point of the variable capacitance elements P1 and P2 and a connection point of the variable capacitance elements P3 and P4.

A current source D is connected to the middle of the inductor L1 and the middle of the inductor L2. A node N1 is connected to the middle of the inductor L3. A node N2 is connected to the middle of the inductor L4. The nodes N1 and N2 are connected to common potential (power supply potential, ground potential, or bias potential) or in a floating state.

The drain of the field effect transistor M1 is connected to the gate of the field effect transistor M1 via the inductor L1 and the drain of the field effect transistor M2 is connected to the gate of the field effect transistor M2 via the inductor L1. Consequently, feedback of 360° is applied only on the drain sides of the field effect transistors M1 and M2. The field effect transistors M1 and M2 can oscillate.

The drain of the field effect transistor M3 is connected to the gate of the field effect transistor M3 via the inductor L2 and the drain of the field effect transistor M4 is connected the gate of the field effect transistor M4 via the inductor L2. Consequently, feedback of 360° is applied only on the drain sides of the field effect transistors M3 and M4. The field effect transistors M3 and M4 can oscillate.

When an electric current flows to the inductor L1, an oscillation signal S1 is generated. Subsequently, when a magnetic flux is generated in the inductor L1 based on the electric current flowing to the inductor L1 and the magnetic flux generated in the inductor L1 interlinks with the inductor L3 to induce an electric current in the inductor L3, an oscillation signal S2 having a phase different from that of the oscillation signal S1 by 90° is generated. When the electric current flowing to the inductor L3 flows to the inductor L4 via the capacitors C1 and C2, an oscillation signal S3 having a phase different from that of the oscillation signal S2 by 90° is generated. When a magnetic flux is generated in the inductor L4 based on the electric current flowing to the inductor L4 and the magnetic flux generated in the inductor L4 interlinks with the inductor L2 to induce an electric current in the inductor L2, an oscillation signal S4 having a phase different from that of the oscillation signal S3 by 90° is generated.

This makes it possible to generate the oscillation signals S1 to S4 having phases different from one another by 90° while applying feedback of 360° only on the drain sides of the field effect transistors M1 to M4. Therefore, it is unnecessary to apply feedback to the source sides of the field effect transistors M1 to M4. Even when drain-to-source capacitance of the field effect transistors M1 to M4 fluctuates, it is possible to reduce a phase error of the oscillation signals S1 to S4.

Figure 2:
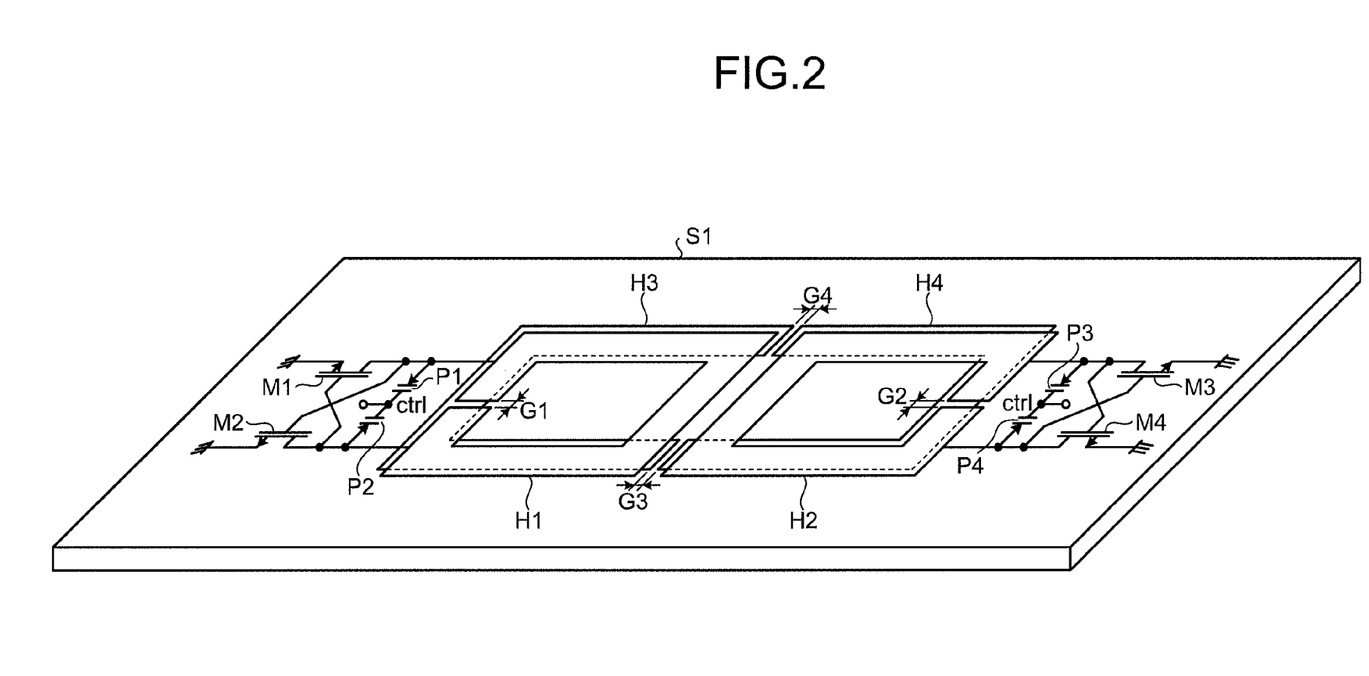
FIG. 2 is a perspective view of an example of the schematic configuration of inductors L1 to L4 shown in FIG. 1.

FIG. 2 is a perspective view of an example of the schematic configuration of the inductors L1 to L4 shown in FIG. 1.

In FIG. 2, the field effect transistors M1 to M4 and wires H1 to H4 are formed on a semiconductor chip S1. The wires H1 and H2 are formed in a loop shape. The wires H1 and H2 are arranged in parallel to each other. Gaps G1 and G2 are respectively formed in the wires H1 and H2.

The wires H3 and H4 are formed in a loop shape. Gaps G3 and G4 are formed between the wires H3 and H4. Capacitive elements or variable capacitance elements can also be used instead of the gaps G3 and G4. The wires H1 and H3 are arranged to overlap each other. The wires H2 and H4 are arranged to overlap each other. The wires H1 and H2 can be placed on the wires H3 and H4 or the wires H3 and H4 can be placed on the wires H1 and H2. The wires H1 to H4 can be made of metal such as Al or Cu. The wires H1 to H4 can be integrated on a semiconductor chip on which the field effect transistors M1 to M4 are formed.

The wire H1 can form the inductor L1 shown in FIG. 1. The wire H2 can form the inductor L2 shown in FIG. 1. The wire H3 can form the inductor L3 shown in FIG. 1. The wire H4 can form the inductor L4 shown in FIG. 1. The gap G3 can form the capacitor C1 shown in FIG. 1. The gap G4 can form the capacitor C2 shown in FIG. 2.

Figure 3A:
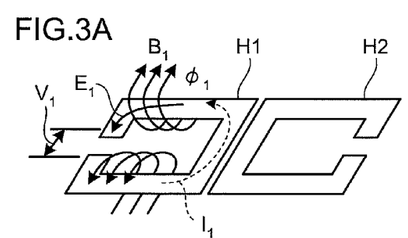
FIGS. 3A to 3E are perspective views for explaining a process for inducing an electric current flowing to the inductors L1 to L4 shown in FIG. 1.
Figure 3B:
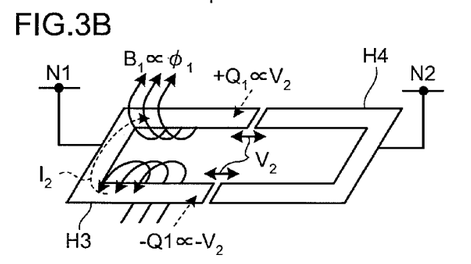
Figure 3C:
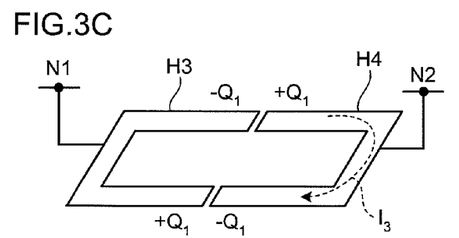
Figure 3D:
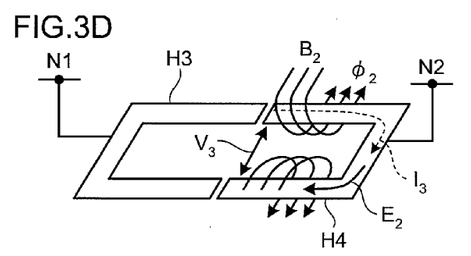
Figure 3E:
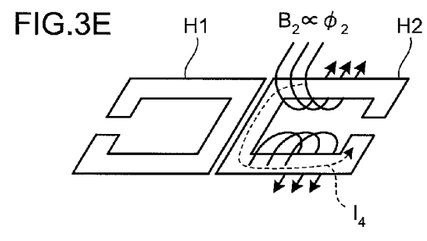
Figure 3F:
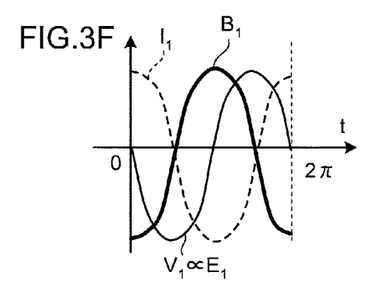
FIGS. 3F to 3J are waveform charts corresponding to FIGS. 3A to 3E for explaining the process for inducing the electric current flowing to the inductors L1 to L4 shown in FIG. 1.
Figure 3G:
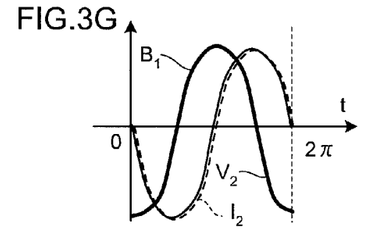
Figure 3H:
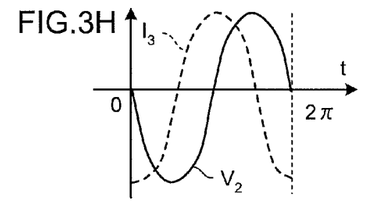
Figure 3I:
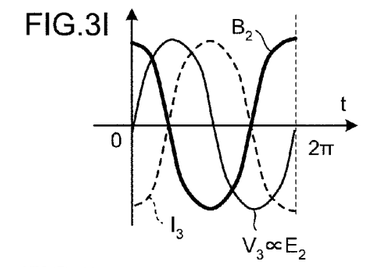
Figure 3J:
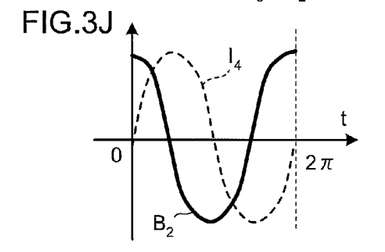
Figure 4:
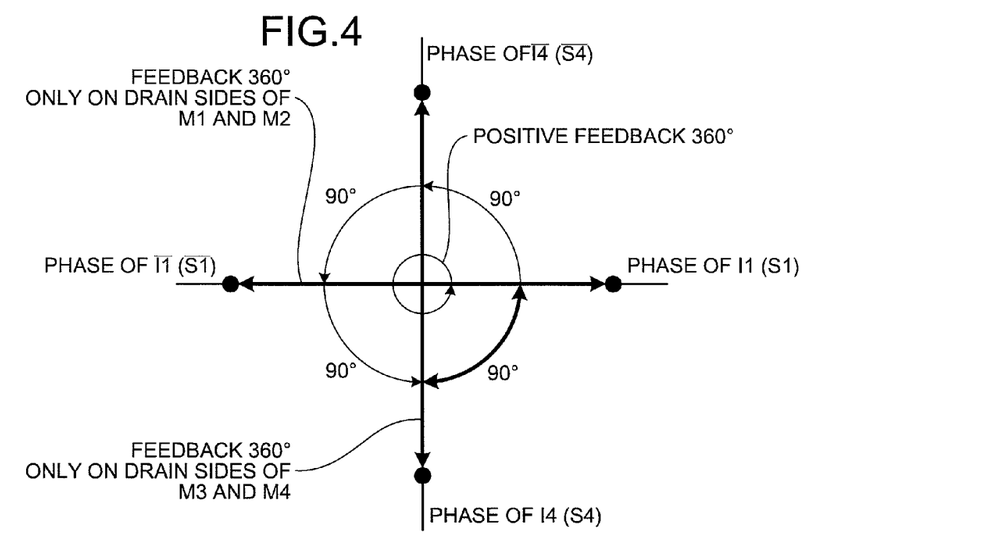
FIG. 4 is a diagram for explaining phase states of the electric current flowing to the inductors L1 to L4 shown in FIG. 1.

FIG. 3A is a perspective view for explaining a process for inducing an electric current flowing to the inductors L1 to L4 shown in FIG. 1. FIG. 3B is a waveform chart of an induced current corresponding to the inducing process shown in FIG. 3A. FIG. 4 is a diagram for explaining phase states of the electric current flowing to the inductors L1 to L4 shown in FIG. 1.

In a1 of FIG. 3A, b1 of FIG. 3B, and FIG. 4, when voltage $V_1$ is applied to the gap G1 of the wire H1 shown in FIG. 2, an electric field $E_1$ is generated in the wire H1. When an electric current $I_1$ flows to the wire H1, a magnetic flux $\phi_1$ is generated in the wire H1. When magnetic flux density at this point is represented as $B_1$ and an interlink area is represented as S, the magnetic flux $\phi_1$ is given by $\phi_1 = B_1 S$. A relation among the voltage $V_1$, the electric field $E_1$, the electric current $I_1$, and the magnetic flux density $B_1$ can be given by the following formula, where, μ represents magnetic permeability and $H_1$ represents the intensity of a magnetic field:

$$V_1 \approx E_1 \approx \frac{\partial I_1(t)}{\partial t}$$

$$\frac{\partial V_1(t)}{\partial t} \propto \oint_C \vec{H} \cdot d\vec{s}$$

As shown in a2 of FIG. 3 and b2 of FIG. 3B, when the magnetic flux $\phi_1$ generated in the wire H1 interlinks with the wire H3, an electric current $I_2$ having a phase different from that of the electric current $I_1$ by 90° is induced in the wire H3. Charge $Q_1$ is accumulated in the gaps G3 and G4 between the wires H3 and H4 and a charge-up voltage $V_2$ is generated. The electric current $I_2$ induced in the wire H3 can be given by the following formula:

$$I_2 = -\frac{\partial \phi_1(t)}{\partial t}$$

As shown in a3 of FIG. 3A and b3 of FIG. 3B, when the charge $Q_1$ is accumulated in the gaps G3 and G4 between the wires H3 and H4, the charge $Q_1$ is discharged to the wire H4. Then, an electric current $I_3$ having a phase different from that of the electric current $I_2$ by 90° flows to the wire H4. The electric current $I_3$ flowing to the wire H4 can be given by the following formula:

$$I_3 \frac{\partial Q_1(t)}{\partial t} = C \frac{\partial V_2(t)}{\partial t}$$

Subsequently, as shown in a4 of FIG. 3A and b4 of FIG. 3B, when the electric current $I_3$ flows to the wire H4, a magnetic flux $\phi_2$ is generated in the wire H4. Voltage $V_3$ is generated between both ends of the wire H4 and an electric field is generated in the wire H4. When magnetic flux density at this point is represented as $B_2$ and an interlink area is represented as S, $\phi_2$ is given by $\phi_2 = B_2 S$. A relation among the voltage $V_3$, the electric field $E_2$, and the electric current $I_3$ can be given by the following formula:

$$V_3 \approx E_2 \approx \frac{\partial I_3(t)}{\partial t}$$

$$\frac{\partial V_3(t)}{\partial t} \propto \oint_C \vec{H} \cdot d\vec{s}$$

As shown in a5 of FIG. 3A and b5 of FIG. 3B, when the magnetic flux $\phi_2$ generated in the wire H4 interlinks with the wire H2, an electric current $I_4$ having a phase different from that of the electric current $I_3$ by 90° is induced in the wire H2. The electric current $I_4$ induced in the wire H2 can be given by the following formula:

$$I_4 = -\frac{\partial \phi_2(t)}{\partial t}$$

As a result, even when feedback of 360° is applied only on the drain sides of the field effect transistors M1 to M4 shown in FIG. 1, it is possible to generate the oscillation signals S1 to S4 having phases different from one another by 90°. Therefore, it is possible to reduce a phase error due to fluctuation in drain-to-source capacitance of the field effect transistors M1 to M4. In the embodiment explained above, the method of integrating the inductors L1 to L4 on the semiconductor chip on which the field effect transistors M1 to M4 are formed is explained as an example. However, the configuration of the inductors L1 to L4 can be discrete.

Figure 5:
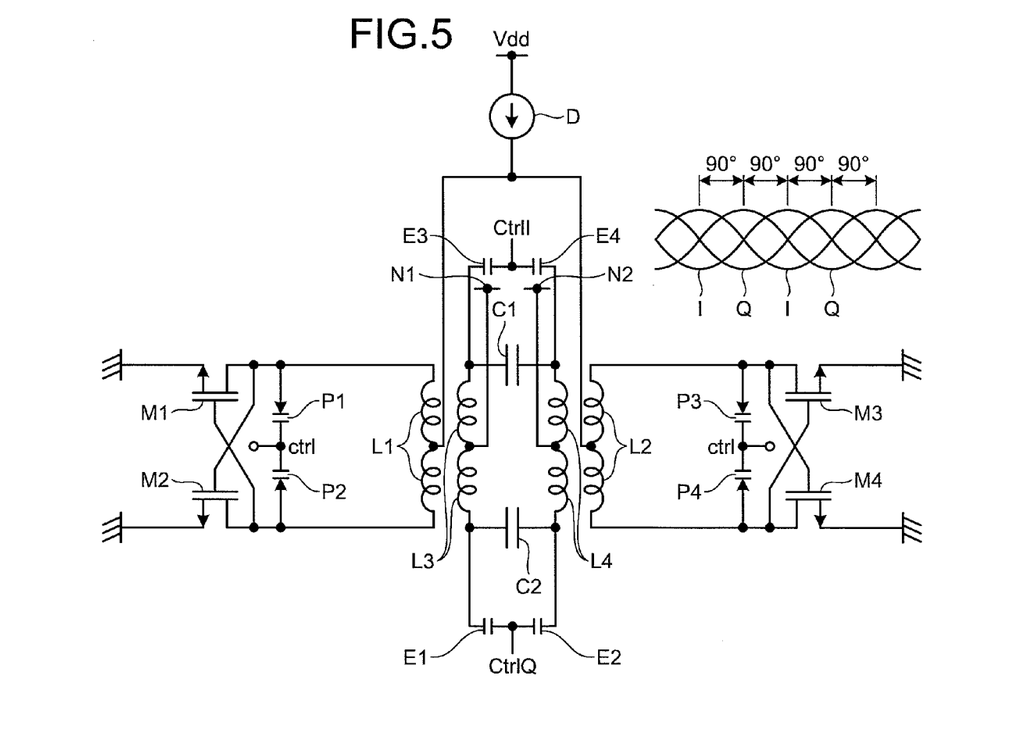
FIG. 5 is a circuit diagram of the schematic configuration of a quadrature modulator according to a second embodiment of the present invention.

FIG. 5 is a circuit diagram of the schematic configuration of a quadrature modulator according to a second embodiment of the present invention.

In FIG. 5, in the quadrature modulator, variable capacitance elements E1 to E4 are provided in addition to the components shown in FIG. 1. One end of the inductor L3 and one end of the inductor L4 are capacitively coupled via the variable capacitance elements E1 and E2. The other end of the inductor L3 and the other end of the inductor L4 are capacitively coupled via the variable capacitance elements E3 and E4. A control signal ctrlQ for controlling the capacitance of the variable capacitance elements E1 and E2 is input to a connection point of the variable capacitance elements E1 and E2. A control signal ctrlI for controlling the capacitance of the variable capacitance elements E3 and E4 is input to a connection point of the variable capacitance elements E3 and E4.

This makes it possible to generate quadrature modulation signals I and Q having phases different from each other by 90° while reducing a phase error.

Figure 6:
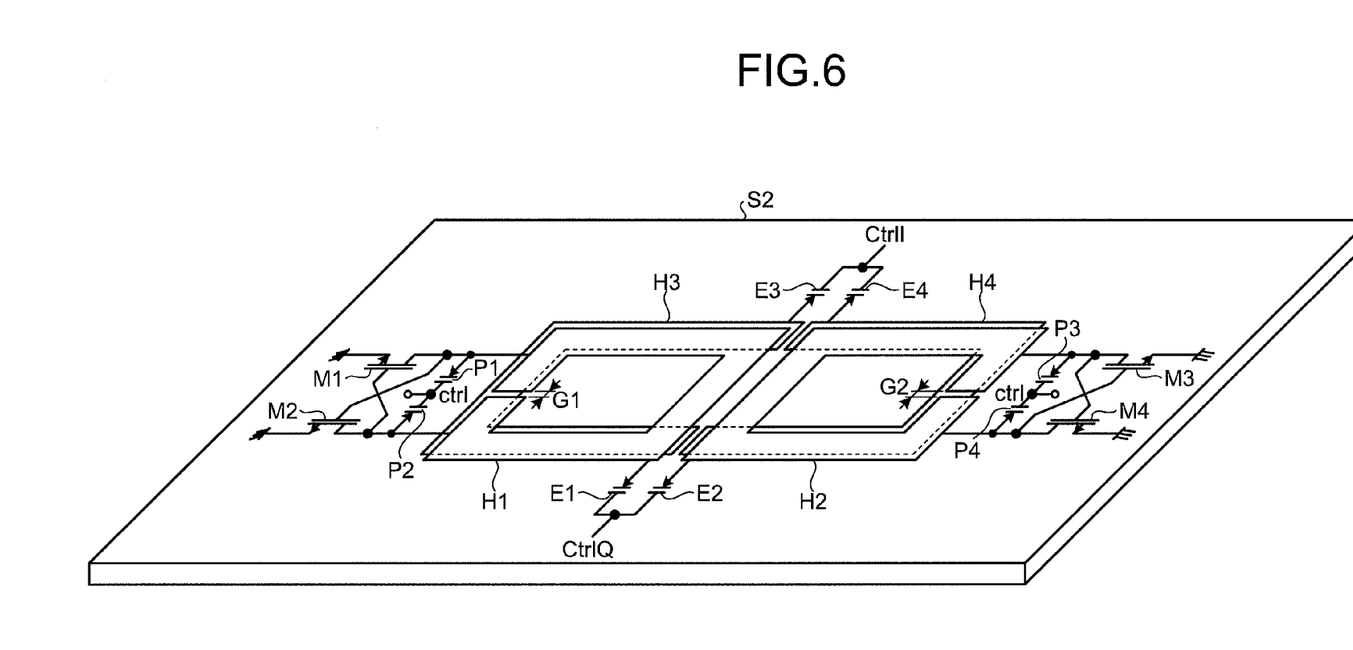
FIG. 6 is a perspective view of an example of the schematic configuration of the inductors L1 to L4 shown in FIG. 5.

FIG. 6 is a perspective view of an example of the schematic configuration of the inductors L1 to L4 shown in FIG. 5.

In FIG. 6, the field effect transistors M1 to M4, the wires H1 to H4, and the variable capacitance elements E1 to E4 are formed on a semiconductor chip S2.

One end of the wire H3 and one end of the wire H4 are capacitively coupled via the variable capacitance elements E1 and E2. The other end of the wire H3 and the other end of the wire H4 are capacitively coupled via the variable capacitance elements E3 and E4.

This makes it possible to integrate the inductors L1 to L4 and the variable capacitance elements E1 to E4 on the semiconductor chip S2 on which the field effect transistors M1 to M4 are formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage control oscillator comprising:
    first and second field effect transistors connected so that a drain of the first field effect transistor is connected to a gate of the second field effect transistor and a drain of the second field effect transistor is connected to a gate of the first field effect transistor;
    third and fourth field effect transistors connected so that a drain of the third field effect transistor is connected to a gate of the fourth field effect transistor and a drain of the fourth field effect transistors is connected to a gate of the third field effect transistor;
    a first inductor connected between the drain of the first field effect transistor and the drain of the second field effect transistor;
    a second inductor connected between the drain of the third field effect transistor and the drain of the fourth field effect transistor;
    a third inductor magnetically coupled to the first inductor;
    a fourth inductor magnetically coupled to the second inductor;
    a first capacitor configured to capacitively couple a first end of the third inductor and a first end of the fourth inductor; and
    a second capacitor configured to capacitively couple a second end of the third inductor and a second end of the fourth inductor.

2. The voltage control oscillator of claim 1, wherein
    first magnetic flux is generated in the first inductor when a first electric current flows to the first inductor,
    a second electric current shifted in phase from the first electric current by 90° is generated in the third inductor when the first magnetic flux in the first inductor interlinks with the third inductor,
    a third electric current shifted in phase from the second electric current by 90° is generated when the second electric current flows into the fourth inductor via the first and second capacitors,
    a second magnetic flux is generated in the fourth inductor when the third electric current flows into the fourth inductor, and
    a fourth electric current shifted in phase from the third electric current by 90° is generated in the second inductor when the second magnetic flux generated in the fourth inductor interlinks with the second inductor.

3. The voltage control oscillator of claim 2, wherein
    a first oscillation signal is generated when the first electric current flows into the first inductor, a second oscillation signal shifted in phase from the first oscillation signal by 90° is generated when the second electric current flows into the third inductor, a third oscillation signal shifted in phase from the first oscillation signal by 180° is generated when the third electric current flows into the fourth inductor, and a fourth oscillation signal shifted in phase from the first oscillation signal by 270° is generated when the fourth electric current flows into the second inductor.

4. The voltage control oscillator of claim 1, wherein feedback of 360° is applied on the drain sides of the first and second field effect transistors and feedback of 360° is applied on the drain sides of the third and fourth field effect transistors.

5. The voltage control oscillator of claim 4, wherein feedback is not applied to sources of the first to fourth field effect transistors.

6. The voltage control oscillator of claim 1, further comprising:

a first wire in a loop shape, comprising the first inductor;

a second wire in a loop shape, comprising the second inductor, in parallel to the first wire;

a third wire in a loop shape, comprising the third inductor, and configured to overlap the first wire;

a fourth wire in a loop shape, comprising the fourth inductor, and configured to overlap the second wire; and a first gap comprising the first capacitor and a second gap comprising the second capacitor, the first and second gaps being configured to separate the third and fourth wires.

7. The voltage control oscillator of claim 6, wherein a first magnetic flux is generated in the first wire when a first electric current flows to the first wire, a second electric current shifted in phase from the first electric current by 90° is induced in the third wire when the first magnetic flux in the first wire interlinks with the third wire, a third electric current shifted in phase from the second electric current by 90° is generated when the second electric current flows to the fourth wire via the first and second gaps, second magnetic flux is generated in the fourth wire when the third electric current flows to the fourth wire, and a fourth electric current shifted in phase from the third electric current by 90° is induced in the second wire when the second magnetic flux in the fourth wire interlinks with the second wire.

8. The voltage control oscillator of claim 7, wherein a first oscillation signal is generated when the first electric current flows to the first wire, a second oscillation signal shifted in phase from the first oscillation signal by 90° is generated when the second electric current flows to the third wire, a third oscillation signal shifted in phase from the first oscillation signal by 180° is generated when the third electric current flows to the fourth wire, and a fourth oscillation signal shifted in phase different from the first oscillation signal by 270° is generated when the fourth electric current flows to the second wire.

9. The voltage control oscillator of claim 6, wherein the first and second gaps comprise capacitors.

10. The voltage control oscillator of claim 6, wherein the first to fourth field effect transistors and the first to fourth wires are located on a semiconductor chip.

11. The voltage control oscillator of claim 1, further comprising:

a current source connected to a middle of the first inductor and a middle of the second inductor; and nodes connecting a middle of the third inductor and a middle of the fourth inductor to common potential.

12. The voltage control oscillator of claim 1, further comprising:

a current source connected to a middle of the first inductor and a middle of the second inductor; and nodes connecting a middle of the third inductor and a middle of the fourth inductor in a floating state.

13. The voltage control oscillator of claim 1, further comprising:

first and second variable capacitors connected to each other in series between the drain of the first field effect transistor and the drain of the second field effect transistor; and third and fourth variable capacitors connected to each other in series between the drain of the third field effect transistor and the drain of the fourth field effect transistor.

14. A quadrature modulator comprising:

first and second field effect transistors connected so that a drain of the first field effect transistor is connected to a gate of the second field effect transistor and a drain of the second field effect transistor is connected to a gate of the first field effect transistor;

third and fourth field effect transistors connected so that a drain of the third field effect transistor is connected to a gate of the fourth field effect transistor and a drain of the fourth field effect transistor is connected to a gate of the third field effect transistor;

a first inductor connected between the drain of the first field effect transistor and the drain of the second field effect transistor;

a second inductor connected between the drain of the third field effect transistor and the drain of the fourth field effect transistor;

a third inductor magnetically coupled to the first inductor;

a fourth inductor magnetically coupled to the second inductor;

a first capacitor configured to capacitively couple a first end of the third inductor and a first end of the fourth inductor;

a second capacitor configured to capacitively couple a second end of the third inductor and a second end of the fourth inductor;

a first variable capacitor connected to the first end of the third inductor;

a second variable capacitor connected to the first end of the fourth inductor;

a third variable capacitor connected to the second end of the third inductor; and a fourth variable capacitor connected to the second end of the fourth inductor.

15. The quadrature modulator of claim 14, wherein first magnetic flux is generated in the first inductor when a first electric current flows to the first inductor, a second electric current shifted in phase from the first electric current by 90° is generated in the third inductor when the first magnetic flux generated in the first inductor interlinks with the third inductor, a third electric current shifted in phase from the second electric current by 90° is generated when the second electric current flows to the fourth inductor via the first and second capacitors, second magnetic flux is generated in the fourth inductor when the third electric current flows to the fourth inductor, and a fourth electric current shifted in phase from the third electric current by 90° is generated in the second inductor when the second magnetic flux generated in the fourth inductor interlinks with the second inductor.

16. The quadrature modulator of claim 15, wherein a first in-phase signal is generated when the first electric current flows to the first inductor, a first orthogonal signal shifted in phase from the first in-phase signal by 90° is generated when the second electric current flows to the third inductor, a second in-phase signal shifted in phase from the first in-phase signal by 180° is generated when the third electric current flows to the fourth inductor, and a second orthogonal signal shifted in phase from the first orthogonal signal by 180° is generated when the fourth electric current flows to the second inductor.

17. The quadrature modulator of claim 14, wherein feedback of 360° is applied on the drain sides of the first and second field effect transistors and feedback of 360° is applied on the drain sides of the third and fourth field effect transistors.

18. The quadrature modulator of claim 17, wherein feedback is not applied to sources of the first to fourth field effect transistors.

19. The quadrature modulator of claim 14, further comprising:

a first wire in a loop shape, comprising the first inductor;

a second wire in a loop shape, comprising the second inductor, in parallel to the first wire;

a third wire in a loop shape, comprising the third inductor, and configured to overlap the first wire;

a fourth wire in a loop shape, comprising the fourth inductor, and configured to overlap the second wire; and a first gap comprising the first capacitor and a second gap comprising the second capacitor, the first and second gaps being configured to separate the third and fourth wires.

20. The quadrature modulator of claim 19, wherein the first to fourth field effect transistors, the first to fourth wires, and the first to fourth variable capacitors are located on a semiconductor chip.

* * * * *